US010552733B2

(12) United States Patent
Torng et al.

(10) Patent No.: US 10,552,733 B2
(45) Date of Patent: *Feb. 4, 2020

(54) MEMORY SUBSYSTEM IN CNN BASED DIGITAL IC FOR ARTIFICIAL INTELLIGENCE

(71) Applicant: GYRFALCON TECHNOLOGY INC., Milpitas, CA (US)

(72) Inventors: Chyu-Jiuh Torng, Dublin, CA (US); Daniel Liu, San Jose, CA (US)

(73) Assignee: Gyrfalcon Technology Inc., Milpitas, CA (US)

( * ) Notice: Subject to any disclaimer, the term of this patent is extended or adjusted under 35 U.S.C. 154(b) by 240 days.

This patent is subject to a terminal disclaimer.

(21) Appl. No.: 15/729,616

(22) Filed: Oct. 10, 2017

(65) Prior Publication Data

US 2018/0285723 A1    Oct. 4, 2018

Related U.S. Application Data

(63) Continuation-in-part of application No. 15/591,069, filed on May 9, 2017, now Pat. No. 10,331,368, and (Continued)

(51) Int. Cl.
*G06N 3/063* (2006.01)
*G06N 3/04* (2006.01)
(Continued)

(52) U.S. Cl.
CPC ........... *G06N 3/063* (2013.01); *G06N 3/0454* (2013.01); *G11C 11/005* (2013.01); (Continued)

(58) Field of Classification Search
CPC ...... G06F 3/0629; G06F 3/0688; G06F 3/061; G06F 13/4068; G06F 13/16; G06N 3/04; (Continued)

(56) References Cited

U.S. PATENT DOCUMENTS 5,355,528 A * 10/1994 Roska .................. G06N 3/0635
706/38
5,717,834 A    2/1998 Werblin et al.
(Continued)

OTHER PUBLICATIONS

USPTO office action for U.S. Appl. No. 15/632,203 (Related case) dated Sep. 20, 2018.
(Continued)

*Primary Examiner* — Khamdan N. Alrobaie

(57) ABSTRACT

CNN (Cellular Neural Networks or Cellular Nonlinear Networks) based digital Integrated Circuit for artificial intelligence contains multiple CNN processing units. Each CNN processing unit contains CNN logic circuits operatively coupling to a memory subsystem having first and second memories. The first memory contains magnetic random access memory (MRAM) cells for storing weights (e.g., filter coefficients) while the second memory is for storing input signals (e.g., imagery data). The first memory may store one-time-programming weights. The memory subsystem may contain a third memory that contains MRAM cells for storing one-time-programming data for security purpose. The second memory contains MRAM cells or static random access memory cells. Each MRAM cell contains a Spin-Orbit-Torque (SOT) based magnetic tunnel junction (MTJ) element.

13 Claims, 4 Drawing Sheets

Related U.S. Application Data a continuation-in-part of application No. 15/498,378, filed on Apr. 26, 2017, and a continuation-in-part of application No. 15/477,263, filed on Apr. 3, 2017, now Pat. No. 10,331,367.

(51) Int. Cl.

| | | |
|---|---|---|
| *G11C 17/16* | (2006.01) | |
| *G11C 11/00* | (2006.01) | |
| *G11C 11/54* | (2006.01) | |
| *G11C 11/16* | (2006.01) | |
| *G11C 11/18* | (2006.01) | |

(52) U.S. Cl.
CPC ........ *G11C 11/161* (2013.01); *G11C 11/1673* (2013.01); *G11C 11/1675* (2013.01); *G11C 11/18* (2013.01); *G11C 11/54* (2013.01); *G11C 17/16* (2013.01)

(58) Field of Classification Search
CPC ..... G11C 11/161; H01L 43/08; H01L 27/222; H01L 43/12
See application file for complete search history.

(56) References Cited

U.S. PATENT DOCUMENTS

| | | | |
|---|---|---|---|
| 7,884,433 B2 | 2/2011 | Zhong et al. | |
| 8,183,061 B2 | 5/2012 | Zhong et al. | |
| 8,324,698 B2 | 12/2012 | Zhong et al. | |
| 8,772,051 B1 | 7/2014 | Zhong et al. | |
| 8,803,293 B2 | 8/2014 | Zhong et al. | |
| 8,933,542 B2 | 1/2015 | Zhong et al. | |
| 9,111,222 B2* | 8/2015 | Aparin | G06N 3/0472 |
| 9,673,388 B2 | 6/2017 | Toh et al. | |
| 9,685,604 B2 | 6/2017 | Huang et al. | |
| 9,734,880 B1* | 8/2017 | Augustine | G06N 3/049 |
| 9,767,557 B1* | 9/2017 | Gulsun | G06T 7/0012 |
| 9,940,534 B1* | 4/2018 | Yang | G06K 9/4628 |
| 9,959,500 B1* | 5/2018 | Torng | G06N 3/08 |
| 10,049,322 B2 | 8/2018 | Ross | |
| 2007/0047294 A1 | 3/2007 | Panchula | |
| 2011/0273926 A1 | 11/2011 | Wu et al. | |
| 2012/0294076 A1 | 11/2012 | Lee et al. | |
| 2012/0294078 A1 | 11/2012 | Kent et al. | |
| 2014/0071741 A1 | 3/2014 | Kim et al. | |
| 2016/0225423 A1* | 8/2016 | Naik | H01L 43/08 |
| 2017/0039472 A1 | 2/2017 | Kudo | |
| 2017/0103298 A1 | 4/2017 | Liang et al. | |
| 2017/0103299 A1 | 4/2017 | Aydonat et al. | |
| 2018/0040811 A1* | 2/2018 | Lee | G11C 11/18 |
| 2018/0137414 A1 | 5/2018 | Du et al. | |
| 2018/0276539 A1* | 9/2018 | Lea | G06N 3/0454 |
| 2018/0315473 A1 | 11/2018 | Jung et al. | |

OTHER PUBLICATIONS

USPTO office action for U.S. Appl. No. 15/477,263 (Parent case) dated Sep. 7, 2018.

USPTO office action for U.S. Appl. No. 15/591,069 (Parent case) dated Sep. 7, 2018.

Zhao et al. "Design of MRAM based Logic Circuits and its Applications", Proceeding GLSVLSI '11 Proceedings of the 21st edition of the great lakes symposium on Great lakes symposium on VLSI pp. 431-436 Lausanne, Switzerland—May 2-4, 2011.

Kodzuka et al. "Effects of boron composition on tunneling magnetoresistance ratio and microstructure of CoFeB/MgO/CoFeB pseudo-spin-valve magnetic tunnel junctions", Journal of Applied Physics 111, 043913 (2012).

Sze et al. "Hardware for Machine Learning: Challenges and Opportunities", Published at an invited conference paper at CICC 2017, Submitted on Dec. 22, 2016 (v1).

L. Thomas et al. "Basic Principles, Challenges and Opportunities of STT-MRAM for Embedded Memory Applications" MSST 2017—Santa Clara, May 17, 2017.

Kultursay et al. "Evaluating STT-RAM as an Energy-Efficient Main Memory Alternative", Published in: Performance Analysis of Systems and Software (ISPASS), 2013 IEEE International Symposium, Apr. 22-23, 2013.

Jabeur et al. "High Performance Spin-Orbit-Torque (SOT) Based Non-volatile Standard Cell for Hybrid CMOS/Magnetic ICs",Computer Science and Information Technology 5(3): 91-96, 2017.

Prenat et al. "Ultra-Fast and High-Reliability SOT-MRAM: From Cache Replacement to Normally-Off Computing", IEEE Transactions on Multi-Scale Computing Systems, vol. 2, No. 1, pp. 49-60, Jan.-Mar. 2016.

Sengupta et al. "Spin Orbit Torque Based Electronic Neuron", School of Electrical & Computer Engineering, Purdue University, West Lafayette, IN, 47906, pp. 1-12.

USPTO office action for U.S. Appl. No. 15/632,203 (related case) dated Feb. 26, 2019.

USPTO notice of allowance for U.S. Appl. No. 15/477,263 (parent case) dated Mar. 11, 2019.

USPTO notice of allowance for U.S. Appl. No. 15/591,069 (parent case) dated Mar. 14, 2019.

USPTO notice of allowance for U.S. Appl. No. 15/632,203 (related case) dated Mar. 25, 2019.

* cited by examiner

MEMORY SUBSYSTEM IN CNN BASED DIGITAL IC FOR ARTIFICIAL INTELLIGENCE

CROSS-REFERENCE TO RELATED APPLICATIONS

This application is a continuation-in-part (CIP) of a co-pending U.S. patent application Ser. No. 15/477,263, entitled "Embedded Memory Subsystems For A CNN Based Processing Unit And Methods Of Making" filed on Apr. 3, 2017. This application is also a CIP of a co-pending U.S. patent application Ser. No. 15/498,378, entitled "Buffer Memory Architecture For A CNN Based Processing Unit And Creation Methods Thereof" filed on Apr. 26, 2017. This application is also a CIP of a co-pending U.S. patent application Ser. No. 15/591,069, entitled "MLC BASED MAGNETIC RANDOM ACCESS MEMORY USED IN CNN BASED DIGITAL IC FOR AI" filed on May 9, 2017. All of which are hereby incorporated by reference in their entirety for all purposes.

FIELD

The invention generally relates to the field of integrated circuit and more particularly to memory subsystem in CNN based digital Integrated Circuit (IC) for Artificial Intelligence (AI).

BACKGROUND

Artificial Intelligence (AI) is defined as intelligence exhibited by machines (e.g., computers, processors, etc.). Intelligence means the ability to acquire and apply knowledge and skills. Many different approaches have been tried and tested in AI research since 1960s. One of the more promising techniques is based on Cellular Neural Networks or Cellular Nonlinear Networks (CNN). CNN have been applied to many different fields and problems including, but limited to, image processing, speech recognition, etc. However, most of the prior art CNN approaches are either based on software solutions (e.g., Convolutional Neural Networks, Recurrent Neural Networks, etc.) or based on hardware that are designed for other purposes (e.g., graphic processing, general computation, etc.). As a result, CNN prior approaches are too slow in term of computational speed and/or too expensive thereby impractical for processing large amount of imagery data. The imagery data can be from any two-dimensional signals (e.g., a still photo, a picture, a frame of a video stream, etc.).

For a CNN based IC for artificial intelligence, data must be provided as close to the CNN processing logic. In addition, different characteristics of data may be required. For example, in image processing, filter coefficients and imagery data have different requirements. Filter coefficients need to be validly stored for long time, while the imagery data are written and read more often.

SUMMARY

This section is for the purpose of summarizing some aspects of the invention and to briefly introduce some preferred embodiments. Simplifications or omissions in this section as well as in the abstract and the title herein may be made to avoid obscuring the purpose of the section. Such simplifications or omissions are not intended to limit the scope of the invention.

For a CNN processing unit for either mobile co-processor or servo co-processor for processing large amount of input signals (e.g., imagery data, voice data, etc.) Processing-in memory or memory-in processor is the most promising approach. Together with low power consumption, read/write speed and highly distributed on the same silicon are the three major requirements.

According to one aspect, CNN (Cellular Neural Networks or Cellular Nonlinear Networks) based digital Integrated Circuit for artificial intelligence contains multiple CNN processing units. Each CNN processing unit contains CNN logic circuits operatively coupling to a memory subsystem having first and second memories. The first memory contains magnetic random access memory (MRAM) cells for storing weights (e.g., filter coefficients) while the second memory is for storing input signals (e.g., imagery data). The first memory may store one-time-programming weights. The memory subsystem may contain a third memory that contains MRAM cells for storing one-time-programming data for security purpose. The second memory contains MRAM cells or static random access memory cells. Each MRAM cell contains a Spin-Orbit-Torque (SOT) based magnetic tunnel junction (MTJ) element.

Other objects, features, and advantages of the invention will become apparent upon examining the following detailed description of an embodiment thereof, taken in conjunction with the attached drawings.

BRIEF DESCRIPTION OF THE DRAWINGS

These and other features, aspects, and advantages of the invention will be better understood with regard to the following description, appended claims, and accompanying drawings as follows:

DETAILED DESCRIPTIONS

In the following description, numerous specific details are set forth in order to provide a thorough understanding of the invention. However, it will become obvious to those skilled in the art that the invention may be practiced without these specific details. The descriptions and representations herein are the common means used by those experienced or skilled in the art to most effectively convey the substance of their work to others skilled in the art. In other instances, well-known methods, procedures, and components have not been described in detail to avoid unnecessarily obscuring aspects of the invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams or circuits representing one or more embodiments of the invention do not inherently indicate any particular order nor imply any limitations in the invention. Used herein, the terms "top", "bottom", "upper", "lower", "vertical", "horizontal", "planar", "parallel", "anti-parallel", "perpendicular", "plan", "elevation" are intended to provide relative positions for the purposes of description, and are not intended to designate an absolute frame of reference. Additionally, term "MTJ element" and "MTJ bit" are interchangeable.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Embodiments of the invention are discussed herein with reference to FIGS. 1-5. However, those skilled in the art will readily appreciate that the detailed description given herein with respect to these figures is for explanatory purposes as the invention extends beyond these limited embodiments.

Figure 1:
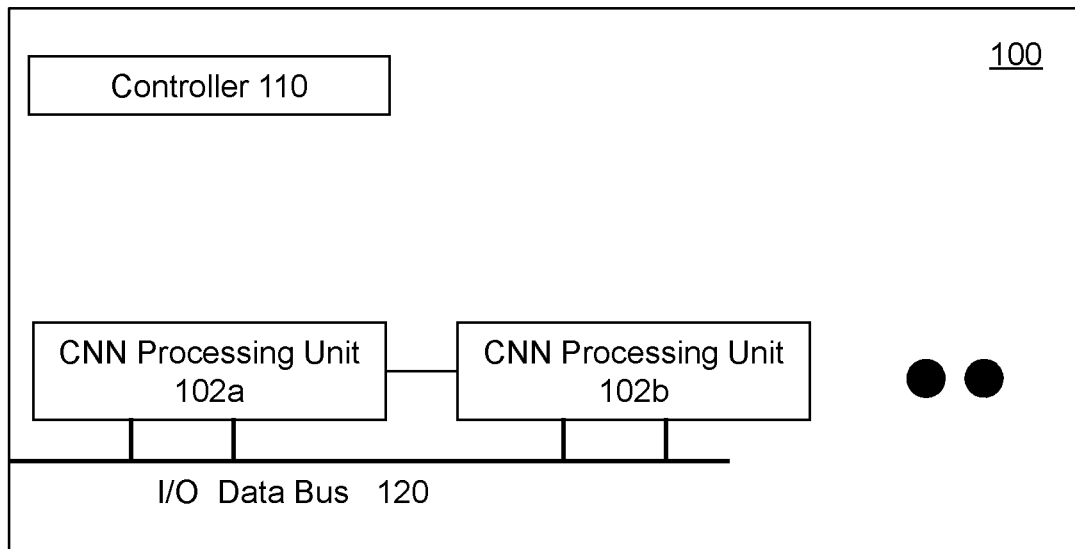
FIG. 1 is a block diagram illustrating an example CNN based IC for artificial intelligence in accordance with one embodiment of the invention.

Referring first to FIG. 1, it is shown a block diagram illustrating an example CNN based digital integrated circuit (IC) for artificial intelligence 100 for artificial intelligence (e.g., image processing, voice reorganization, etc.) in accordance with one embodiment of the invention.

The IC 100 is implemented as a digital semi-conductor chip (e.g., a silicon substrate) and contains a controller 110, and a plurality of CNN processing units 102a-102b operatively coupled to at least one input/output (I/O) data bus 120. Controller 110 is configured to control various operations of the CNN processing units 102a-102b, which are connected in a loop with a clock-skew circuit (e.g., D flip-flop).

In one embodiment, the digital integrated circuit 100 is extendable and scalable. For example, multiple copy of the digital integrated circuit 100 can be implemented on a single semi-conductor chip.

Figure 2A:
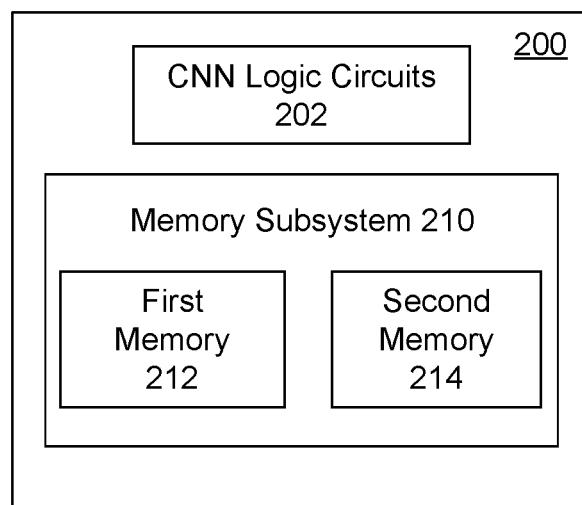
FIG. 2A is a function block diagram showing an example CNN processing unit including a first example memory subsystem according to an embodiment of the invention.
Figure 2B:
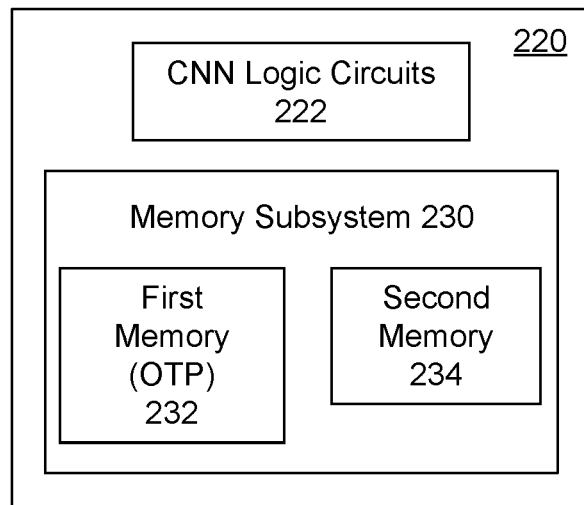
FIG. 2B is a function block diagram showing another example CNN processing unit including a second example memory subsystem according to an embodiment of the invention.

All of the CNN processing units are identical. For illustrating simplicity, function block diagram of an example CNN processing unit 200 is shown in FIG. 2A. The invention sets no limit to the number of CNN processing units on a digital semi-conductor chip.

Each CNN processing unit 200 contains CNN logic circuits 202, which is operatively coupled to an embedded memory subsystem 210. In other words, the memories of the embedded memory subsystem 210 and the CNN logic circuits 202 are located on the same digital semi-conductor chip. In one embodiment, CNN logic circuits 202 are for performing convolution operations of input signals with filter coefficients (or weights). In one embodiment, the input signals are imagery data. In another embodiment, the input signals are converted voice data.

Memory subsystem 210 is made of a first memory 212 and a second memory 214. The first memory 212 is for requiring data being stored with higher retention rate than the second memory 214. The second memory 214 is for facilitating higher endurance of balanced data read and write operations than the first memory 212. In one embodiment, the first memory 212 is for storing weights (e.g., filter coefficients) while the second memory 214 is for storing input signals (e.g., imagery data in an image processing application).

In one embodiment, the first memory 212 contains a first group of magnetic random access memory (MRAM) cells. The second memory 214 contains a second group of magnetic random access memory cells. Each of the magnetic random access memory cells contains a Spin-Orbit-Torque (SOT) based magnetic tunnel junction (MTJ) element.

Figure 3A:
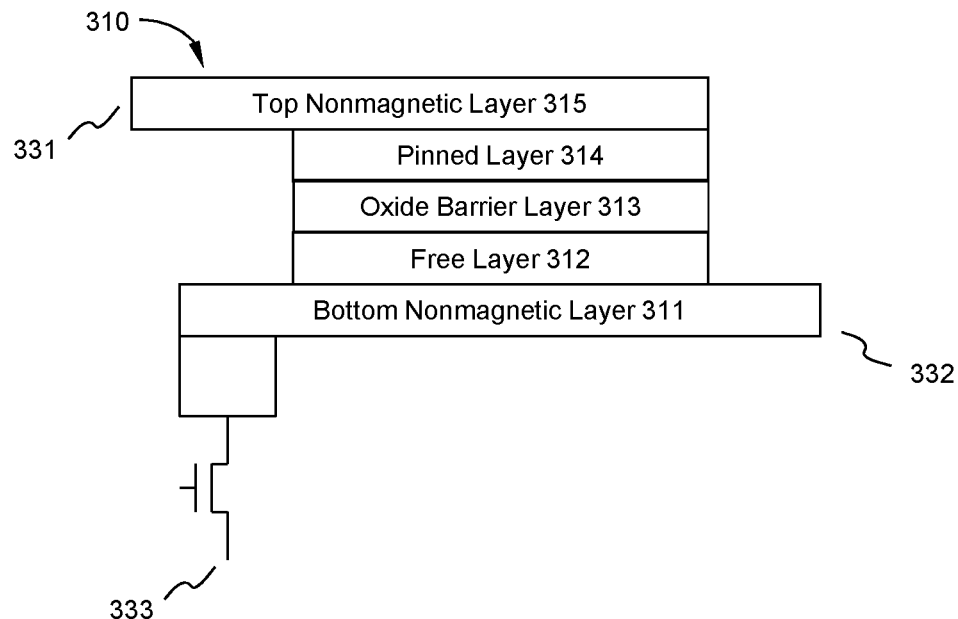
FIG. 3A is a schematic diagram showing 3-terminal structure of an example SOT based MTJ element, according to an embodiment of the invention.

A schematic diagram of 3-terminal structure of an example SOT based MTJ element 310 is shown in FIG. 3A. The example SOT based MTJ element 310 contains multiple layers: bottom nonmagnetic layer 311, free layer 312, oxide barrier layer 313, pinned layer 314 and top nonmagnetic layer 315. Both the free layer 312 and the pinned layer 314 are made of ferromagnetic metal (e.g., cobalt, iron, nickel, etc.). The oxide barrier layer 313 is an insulator, for example, alumina oxide, magnesium oxide, etc. The pinned layer 314 has a pinned magnetization as a reference layer while the free layer 312 has a free magnetization as a storage layer.

The free layer 312 is in contact with a bottom nonmagnetic layer 311 made of heavy metal (e.g., Platinum (Pt), Tantalum (Ta), etc.). When injecting an electric current in the bottom nonmagnetic layer 311, Spin-Orbit coupling leads to a perpendicular spin current induced by the spin Hall and Rashba-like effects, which is transferred to the magnetization creating a spin torque and inducing magnetization reversal.

Figure 3B:
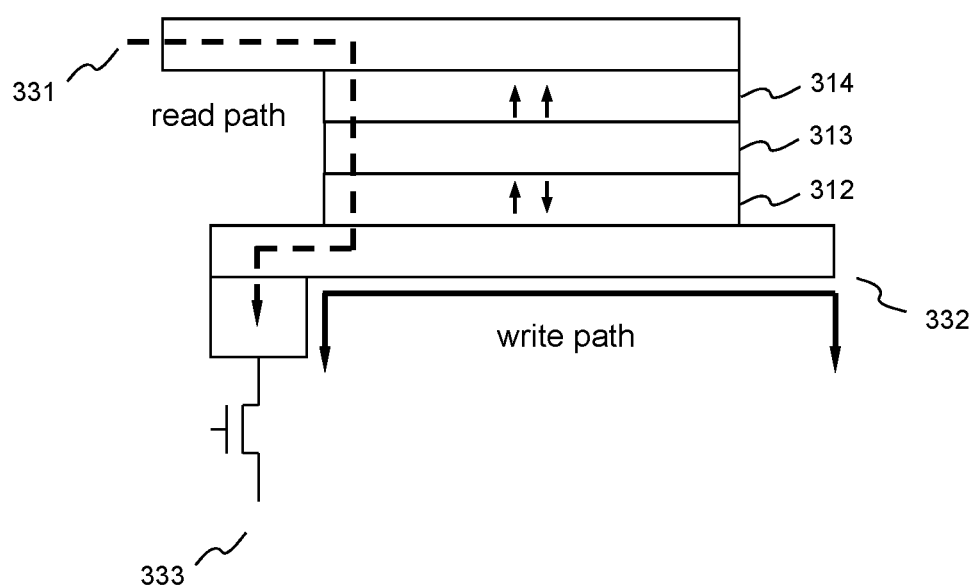
FIG. 3B is a diagram showing read and write paths of the example SOT based MTJ element of FIG. 3A, according to an embodiment of the invention.

Each SOT based MTJ element 310 contains three terminals (i.e., terminal-1 331, terminal-2 332 and terminal-3 333) for facilitating separate paths shown in FIG. 3B for read and write electric current pulses. The read path (shown as broken line) is from terminal-1 331 to terminal-3 333, while the bi-directional write path is between terminal-2 332 and terminal-3 333. Magnetization direction of free layer 312 and pinned layer 314 is vertical or perpendicular or out-of-plane.

Figure 4:
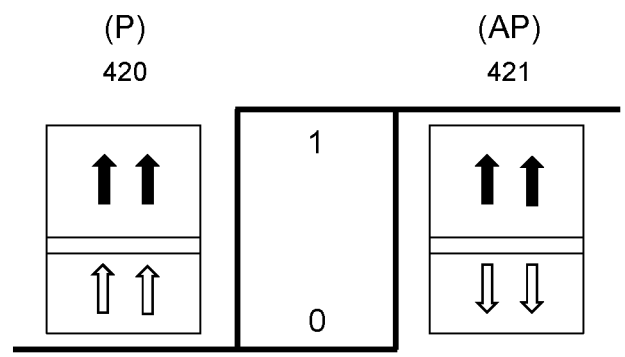
FIG. 4 is a diagram showing two distinct states of an example SOT based MTJ element, according to an embodiment of the invention.

FIG. 4 shows the magnetization direction (shown as hollow arrows) of the free layer 312 can be switched between two stable states, either parallel (P) 420 or anti-parallel (AP) 421 with respect to the magnetization direction (shown as solid arrows) in the pinned layer 314. The relative direction of magnetization of free layer 312 and pinned layer 314 gives two different states (i.e., zero and one) of the example MTJ element 310.

Figure 5:
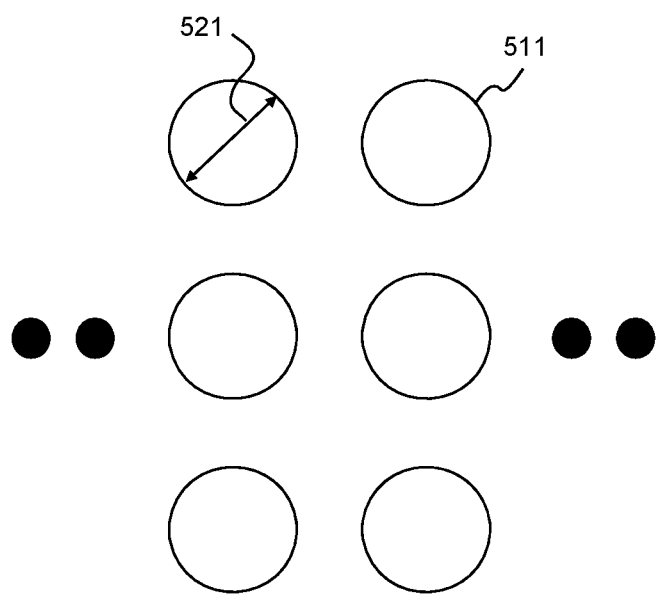
FIG. 5 is a plan view showing respective SOT based MTJ elements of an example array of MRAM cells, according to an embodiment of the invention.

FIG. 5 shows a circular planar shape 511 of respective SOT based MTJ elements of an array of MRAM cells. The first group of MRAM cells of the first memory 212 and the second group of MRAM cells of the second memory 214 can be arranged with the same pitch or different pitch.

A SOT based MTJ element of the first memory 212 can have a range of 20-500 nm (nanometer) in diameter 521. The dimension range for the second memory 214 is 20-200 nm in diameter 521. In general, it is easier to fabricate larger size SOT based MTJ elements than smaller ones.

Furthermore, the order of layers in the example SOT based MTJ elements 310 can be reversed to achieve the same purpose.

In another embodiment, the first memory 212 contains a group of magnetic random access memory (MRAM) cells. The second memory 214 contains a group of static random access memory (SRAM) cells. Each of the magnetic random access memory cells contains a Spin-Orbit-Torque (SOT) based magnetic tunnel junction (MTJ) element.

Referring back to FIG. 2B, it is shown another example CNN processing unit 220, which contains CNN logic circuits 222 operatively coupling to a memory subsystem 230. The memory subsystem 230 includes first memory 232 and second memory 234. The first memory 232 is for storing one-time-programming (OTP) filter coefficients or weights that are stored once and never changed. In other words, one specific set of filters are stored in the memory subsystem of respective CNN processing units of a CNN based digital IC for AI, which is designed for performing one specific task (e.g., extracting a particular feature of an image such as traffic signal recognition, lane keeping, etc.). The second memory 234 is for storing imagery data, which requires frequent read/write operations.

In one embodiment, both first and second memories 232-234 are made of MRAM cells with SOT based MTJ elements. In another embodiment, the second memory 234 contains a group of SRAM cells instead of MRAM cells.

Figure 2C:
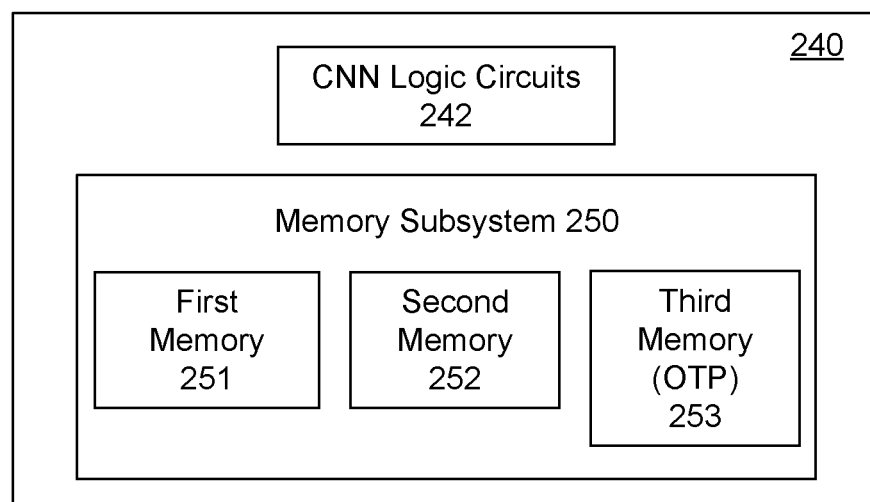
FIG. 2C is a function block diagram showing yet another example CNN processing unit including a third example memory subsystem according to an embodiment of the invention.

A further embodiment shown in FIG. 2C, a CNN processing unit 240 comprises CNN logic circuits 242 operatively coupling to a memory subsystem 250. The memory subsystem 250 contains first memory 251, second memory 252 and third memory 253. The first memory 251 is for storing filter coefficients and the second memory 252 is for storing imagery data substantially similar to the CNN processing unit 200 of FIG. 2A. The third memory 253 is a one-time-programming (OTP) memory that can be used for other purposes (e.g., a unique pattern for security).

In one embodiment, all three memories 251-253 are made of MRAM cells with SOT based MTJ elements. In another embodiment, the second memory 252 is made of SRAM cells instead of MRAM cells.

OTP is referred to data being written to memory only one time (e.g., substantially permanent once written). For a MRAM cell, OTP can be performed in many stages: wafer level, chip level, after soldering during fabrication of a CNN based digital IC. For example, a specific application such as face recognition requires a particular set of filter coefficients, which can be permanently written to an IC (i.e., first memory 232 in FIG. 2B) during fabrication. Or a specific usage (e.g., security for certain application or user), the data is permanently written to an IC (i.e., third memory 253 in FIG. 2C).

OTP can also be performed after fabrication during use, for example, a specific pattern unique to any application and any user is created and programmed (i.e., written) to the OTP memory in an initialization procedure or at first use. In one embodiment, one user can write a particular set of filter coefficients to an IC (i.e., first memory 232 in FIG. 2B) for one type of applications, while another user can write a different set of filter coefficients for another type of applications. In another embodiment, a unique pattern of data (e.g., user data such as user identification, name, number, fingerprint, etc.) can be written to an IC (i.e., third memory 253 in FIG. 2C) during use for security or other purposes.

To break down the oxide barrier layer of an SOT based MTJ element for creating OTP memory, a number of techniques may be used as follows:
 (a) applying an electric voltage higher than normal read/write voltage (a range of 100-700 mV (millivolts)) during fabrication or use;
 (b) applying an electric current longer than normal read/write time or duty cycle of 5 ns (nanoseconds) during fabrication or use; and
 (c) setting different size of SOT based MTJ elements (bits) in a range of 20-200 nm in diameter for SOT based MTJ element during fabrication, the smaller size is easier for respective oxide barrier layers to be broken down.

Furthermore, the aforementioned techniques can be used alone or in any combinations, for example, (a) and (c), (a) and (b), or (b) and (c).

Although the invention has been described with reference to specific embodiments thereof, these embodiments are merely illustrative, and not restrictive of, the invention. Various modifications or changes to the specifically disclosed exemplary embodiments will be suggested to persons skilled in the art. For example, whereas image processing has been shown and described as an example usage of the CNN based digital IC, other applications may be used, for example, voice recognition. Sound waves can be recorded and converted into a series of digital images (e.g., using fast Fourier Transform), whose features in turn can be extracted using a CNN based digital IC. Furthermore, two groups of different sized MTJ elements have been shown and described for the at least two groups, any number of groups of different sized MTJ elements may be used for achieving the same, for example, three groups. Additionally, the order of the layers in example SOT based MTJ elements has been shown and described in one particular pattern, other patterns may be used for achieving the same, for example, the order of the fixed or pinned layer and the free layer can be reversed. In summary, the scope of the invention should not be restricted to the specific exemplary embodiments disclosed herein, and all modifications that are readily suggested to those of ordinary skill in the art should be included within the spirit and purview of this application and scope of the appended claims.

What is claimed is:
1. A digital integrated circuit for artificial intelligence comprising:
 a semi-conductor substrate embedded in a single semi-conductor chip, the semi-conductor substrate containing a plurality of cellular neural networks (CNN) processing units, each CNN processing unit comprising:
 CNN logic circuits; and
 an embedded memory subsystem operatively coupled to the CNN logic circuits;
 the embedded memory subsystem further comprising:
 a first memory for storing a set of weights, the first memory including a first plurality of magnetic random access memory (MRAM) cells with each of the first plurality of MRAM cells containing a first Spin-Orbit-Torque (SOT) based magnetic tunnel junction (MTJ) element; and
a second memory for storing input signals that require higher endurance of balanced data read and write operations than the first memory.

2. The digital integrated circuit of claim 1, wherein the first SOT based MTJ element comprises a circular planar shape having a range of 20-500 nm in diameter.

3. The digital integrated circuit of claim 1, wherein the second memory includes a second plurality of magnetic random access memory (MRAM) cells with each of the second plurality of MRAM cells containing a second Spin-Orbit-Torque (SOT) based magnetic tunnel junction (MTJ) element.

4. The digital integrated circuit of claim 3, wherein the second SOT based MTJ element comprises a circular planar shape having a range of 20-200 nm in diameter.

5. The digital integrated circuit of claim 1, wherein the second memory contains a plurality of static random access memory (SRAM) cells.

6. A digital integrated circuit for artificial intelligence comprising:
a semi-conductor substrate embedded in a single semi-conductor chip, the semi-conductor substrate containing a plurality of cellular neural networks (CNN) processing units, each CNN processing unit comprising:
CNN logic circuits; and
an embedded memory subsystem operatively coupled to the CNN logic circuits;
the embedded memory subsystem further comprising:
a first memory for storing a set of one-time-programming weights, the first memory including a first plurality of magnetic random access memory (MRAM) cells with each of the first plurality of MRAM cells containing a first Spin-Orbit-Torque (SOT) based magnetic tunnel junction (MTJ) element; and
a second memory for storing input signals that require higher endurance of balanced data read and write operations than the first memory.

7. The digital integrated circuit of claim 6, wherein the second memory includes a second plurality of MRAM cells with each of the second plurality of MRAM cells containing a second Spin-Orbit-Torque (SOT) based MTJ element.

8. The digital integrated circuit of claim 7, wherein each of the first and the second SOT based MTJ elements has a circular planar shape.

9. The digital integrated circuit of claim 6, wherein the second memory contains a plurality of static random access memory (SRAM) cells.

10. A digital integrated circuit for artificial intelligence comprising:
a semi-conductor substrate embedded in a single semi-conductor chip, the semi-conductor substrate containing a plurality of cellular neural networks (CNN) processing units, each CNN processing unit comprising:
CNN logic circuits; and
an embedded memory subsystem operatively coupled to the CNN logic circuits;
the embedded memory subsystem further comprising:
a first memory for storing a set of weights, the first memory including a first plurality of magnetic random access memory (MRAM) cells with each of the first plurality of MRAM cells containing a first Spin-Orbit-Torque (SOT) based magnetic tunnel junction (MTJ) element;
a second memory for storing input signals that require higher endurance of balanced data read and write operations than the first memory; and
a third memory for storing a one-time-programming unique data pattern written thereon for security purpose.

11. The digital integrated circuit of claim 10, wherein the second memory includes a second plurality of MRAM cells with each of the second plurality of MRAM cells containing a second Spin-Orbit-Torque (SOT) based MTJ element, and the third memory includes a third plurality of MRAM cells with each of the third plurality of MRAM cells containing a third Spin-Orbit-Torque (SOT) based MTJ element.

12. The digital integrated circuit of claim 10, wherein the second memory contains a plurality of static random access memory (SRAM) cells, and the third memory includes a second plurality of MRAM cells with each of the second plurality of MRAM cells containing a second Spin-Orbit-Torque (SOT) based MTJ element.

13. The digital integrated circuit of claim 10, wherein the semi-conductor substrate comprises a silicon chip.

* * * * *